(12) United States Patent
Fukasawa et al.

(10) Patent No.: US 6,396,082 B1
(45) Date of Patent: May 28, 2002

(54) LIGHT-EMITTING DIODE

(75) Inventors: Koichi Fukasawa, Yamanashi; Junji Miyashita; Kousuke Tsuchiya, both of Fujiyoshida, all of (JP)

(73) Assignee: Citizen Electronics Co., Ltd., Yamanashi (JP)

(*) Notice: Subject to any disclaimer, the term of this patent is extended or adjusted under 35 U.S.C. 154(b) by 0 days.

(21) Appl. No.: 09/787,873

(22) PCT Filed: Jul. 27, 2000

(86) PCT No.: PCT/JP00/05038

§ 371 (c)(1),
(2), (4) Date: Mar. 23, 2001

(87) PCT Pub. No.: WO01/09963

PCT Pub. Date: Feb. 8, 2001

(30) Foreign Application Priority Data

Jul. 29, 1999 (JP) .......................... 11-214527
Sep. 2, 1999 (JP) .......................... 11-249030

(51) Int. Cl.[7] .............................................. H01L 27/15
(52) U.S. Cl. ........................ 257/79; 257/98; 257/99; 257/100; 257/433; 257/684
(58) Field of Search ................. 257/79, 81, 94, 257/95, 98, 99, 100, 433, 684, 676

(56) References Cited

U.S. PATENT DOCUMENTS 6,219,074 B1 * 4/2001 Chosa et al. ............... 347/130
6,274,890 B1 * 8/2001 Oshio et al. ................ 257/98

FOREIGN PATENT DOCUMENTS

| JP | 10-151794 | 6/1998 |
| JP | 11046018 A | * 2/1999 |
| JP | 11162232 A | * 6/1999 |
| JP | 11-163409 | 6/1999 |
| JP | 11-186590 | 7/1999 |
| JP | 11-191636 | 7/1999 |
| JP | 11-261109 | 9/1999 |
| JP | 2000-208821 | 7/2000 |

* cited by examiner

Primary Examiner—Nathan Flynn
Assistant Examiner—Remmon R. Fordé
(74) Attorney, Agent, or Firm—Browdy and Neimark (57) ABSTRACT

A light emitting diode 21 in which a through hole 25 is provided in a glass epoxy substrate 22 which extends from the upper surface 26a to the lower surface 26b thereof, a transparent resin section 27 is used to fill the through hole 25, a light emitting diode element 29 made of a gallium nitride based compound semiconductor with a transparent element substrate of sapphire glass 30 is fixed on top of the transparent resin section 27 using a transparent adhesive 37, and light blocking electrodes 33, 34 are provided on the upper surface of the light emitting diode element 29, and light emitted from the light emitting diode element 29 passes through the transparent resin section 27 and is guided out through a bottom surface 26b of the glass epoxy substrate 22. When the light emitting diode 21 is mounted onto a motherboard 41, by dropping the resin sealing body 38 of the light emitting diode 21 down into an insertion hole 42 formed in the motherboard 41, the height dimension of the mounted light emitting diode 21 mounted can be reduced.

8 Claims, 10 Drawing Sheets

LIGHT-EMITTING DIODE

REFERENCE TO RELATED APPLICATIONS

The present application is the national stage under 35 U.S.C. §371 of international application PCT/JP00/05038, filed Jul. 27, 2000 which designated the United States, and which application was not published in the English language.

TECHNICAL FIELD

The present invention relates to a surface mounted light emitting diode.

BACKGROUND ART

Figure 11:
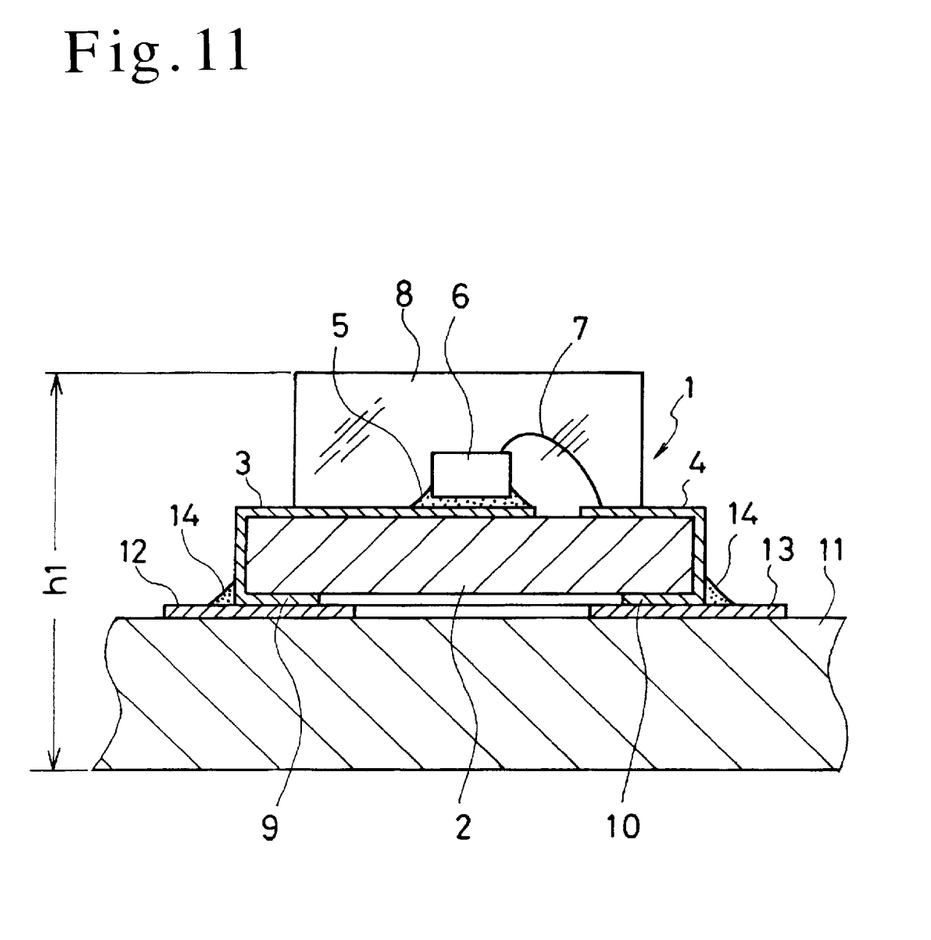
FIG. 11 is a cross-sectional view showing a conventional light emitting diode mounted onto a motherboard.

Light emitting diodes of this type are known such as the device shown in FIG. 11. In the light emitting diode 1 shown in the figure, a pair of external connection electrodes (a cathode electrode 3 and an anode electrode 4) are formed by patterning on the upper surface of a glass epoxy substrate 2, and a light emitting diode element 6 is then fixed on top of the cathode electrode 3 with an electrically conductive adhesive 5. The upper surface electrode of the light emitting diode element 6 and the anode electrode 4 are connected with a bonding wire 7, and the bonding wire 7 and the light emitting diode element 6 are sealed with a resin sealing body 8. To enable subsequent use, the light emitting diode 1 is then mounted on a motherboard 11, and lower surface electrodes 9, 10, which are merely a portion of the external connection electrodes, are then fixed with solder 14 to printed wiring 12, 13 on the motherboard 11 to complete the surface mounting process.

However, in the conventional light emitting diode 1 described above, the overall height dimension h1 following mounting on the motherboard 11 includes the board thickness of the motherboard 11 plus the thickness of the glass epoxy substrate 2 and the resin sealing body 8 of the light emitting diode 1, and as such is unable to sufficiently meet the demands for thinner devices.

Furthermore, in the conventional light emitting diode 1 described above, the light emitting diode 1 is mounted on the motherboard 11 in an upward facing direction, and because light emission occurs through the resin sealing body 8, prolonged use of the light emitting diode 1 leads to a reduction in light emission intensity due to factors such as a deterioration in the resin sealing body 8 due to the ultraviolet light.

An object of the present invention is to provide a surface mounted light emitting diode which when mounted on a motherboard suppresses the overall height dimension including the motherboard to a minimum, enabling a shift to thinner devices.

Furthermore, another object of the present invention is to provide a highly reliable light emitting diode which does not suffer from a reduction in light emission intensity, even with continued use over prolonged periods.

DISCLOSURE OF THE INVENTION

A light emitting diode according to the present invention is a light emitting diode prepared by mounting a light emitting diode element on an upper surface of a base material, and then protecting the light emitting diode element with a resin sealing body, wherein a transparent body is provided in the aforementioned base material which extends from the upper surface through to the lower surface thereof, the light emitting diode element made of a gallium nitride based compound semiconductor with a transparent element substrate is fixed on top of the transparent body using a transparent adhesive, and a non-transparent section is provided above the light emitting diode element, and light emitted from the light emitting diode element passes through the transparent body and is guided out through the lower surface of the base material.

According to this invention, because light emitted from the light emitting diode element passes through the transparent body and is guided out through the bottom surface of the base material, by mounting the light emitting diode upside down on the motherboard, light can be irradiated in an upward direction from the motherboard. Moreover, by dropping the light emitting diode down into a hole formed in the motherboard, the overall height dimension of the light emitting diode, including the thickness of the motherboard, can be reduced to a value smaller than conventional surface mounted devices.

Furthermore, in a light emitting diode according to another aspect of the present invention, a through hole is provided in the aforementioned base material which extends from the upper surface through to the lower surface thereof, and the aforementioned transparent body is formed by filling this through hole with a transparent resin.

According to this invention, because light emitted from the light emitting diode element passes through the transparent resin filling the through hole in the base material and is guided out through the bottom surface of the base material, the emitted light does not diffuse and displays good directivity.

Furthermore, in a light emitting diode according to yet another aspect of the present invention, a fluorescent material comprising an yttrium compound is dispersed and mixed into at least one of the aforementioned transparent body and the transparent adhesive.

According to this invention, because a fluorescent compound comprising an yttrium compound is incorporated in either the transparent body which makes up all, or a part of the base material, or in the transparent adhesive used for fixing the light emitting diode element, and enables the generation of white colored light, surface mounted white colored light emitting diodes can be produced which are thinner than conventional devices.

Furthermore, in a light emitting diode according to yet another aspect of the present invention, a condenser lens section is provided on the lower surface of the aforementioned base material, below the transparent body.

According to this invention, by providing the condenser lens section, light passing through the bottom surface of the base material is condensed, improving the light emission intensity another level.

Furthermore, in a light emitting diode according to yet another aspect of the present invention, the aforementioned base material is any one of a glass epoxy substrate, a transparent resin substrate and a transparent glass substrate.

According to this invention, by making the light emitted from the light emitting diode element passes through the transparent glass substrate side which is less likely to deteriorate on exposure to ultraviolet light, light emission of a good intensity level can be maintained even after prolonged use.

Furthermore, in a light emitting diode according to yet another aspect of the present invention, the aforementioned non-transparent section provided above the light emitting diode element is either one of a pair of light blocking electrodes provided on the upper surface of the light emitting diode element, and a reflective film covering the outer surface of the transparent resin sealing body.

According to this invention, light emitted from the light emitting diode element is guided efficiently through the lower surface of the base material.

Furthermore, in a light emitting diode according to yet another aspect of the present invention, when the light emitting diode is mounted on a motherboard, the light emitting diode is mounted upside down with the resin sealing body dropping into a hole provided in the motherboard, and the periphery sections of this hole connect the external connection electrodes of the light emitting diode with the wiring pattern of the motherboard.

According to this invention, when the light emitting diode is mounted upside down on the motherboard, by soldering the aforementioned external connection electrodes to the wiring pattern on the motherboard, current can be carried to the light emitting diode element, and so the mounting operation is extremely simple. Furthermore, the height dimension by which the light emitting diode protrudes from the motherboard can be reduced dramatically.

BEST MODE FOR CARRYING OUT THE INVENTION

Light emitting diodes of the present invention will be described below in further detail with reference to the appended drawings.

Figure 1:
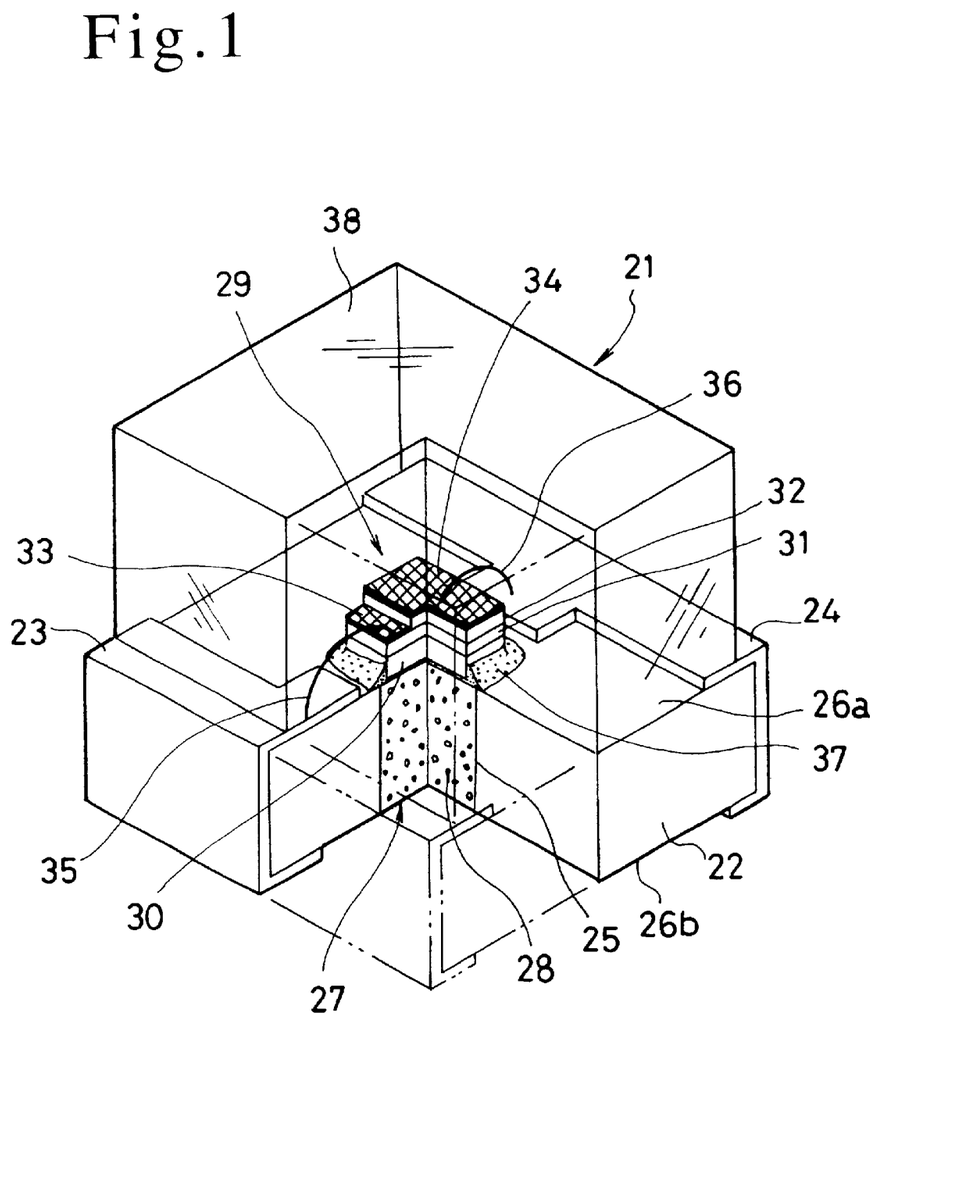
FIG. 1 is a perspective view showing a first embodiment of a light emitting diode according to the present invention.
Figure 2:
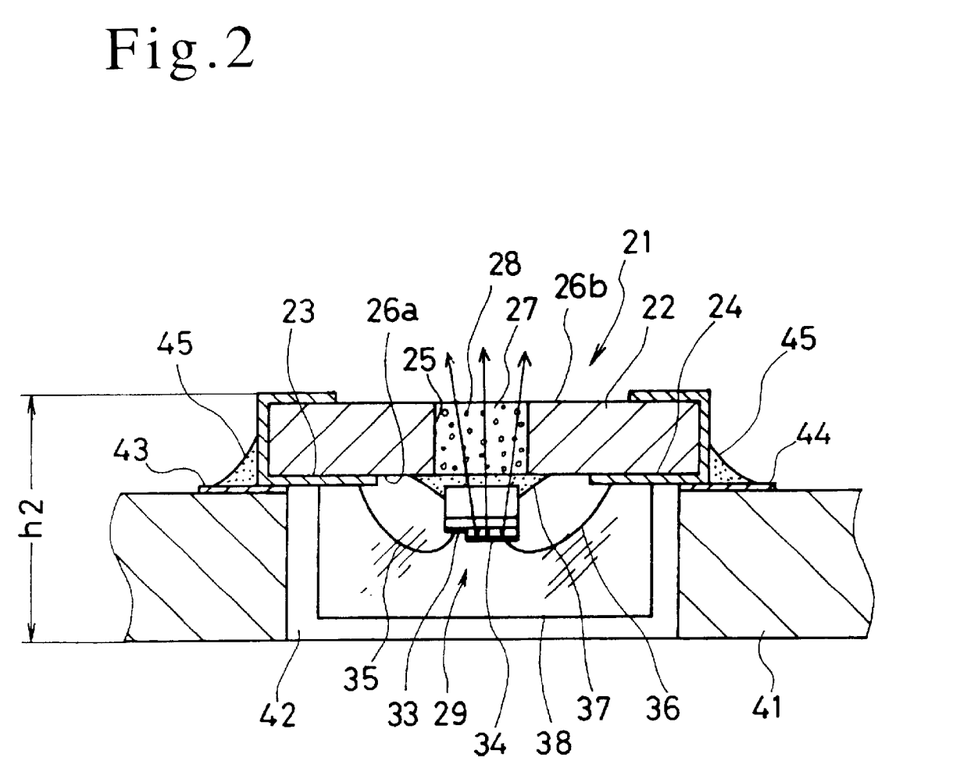
FIG. 2 is a cross-sectional view showing the light emitting diode of FIG. 1 mounted onto a motherboard.

FIG. 1 and FIG. 2 are diagrams showing a first embodiment of a surface mounted light emitting diode. In the surface mounted light emitting diode 21 according to this embodiment, a pair of external connection electrodes (a cathode electrode 23 and an anode electrode 24) are formed by patterning on the upper surface of a rectangular glass epoxy substrate 22 which serves as a base material, and a through hole 25 with a square shaped cross section is provided in the central area of the glass epoxy substrate 22 and passes from the upper surface 26a thereof through to the lower surface 26b. This through hole 25 is filled with a transparent resin, forming a transparent resin section 27 which is substantially level with the upper surface 26a and the lower surface 26b of the glass epoxy substrate 22. In this embodiment, a fluorescent material 28 comprising an yttrium compound or the like is dispersed within the transparent resin section 27, and converts blue light into white light through a wavelength conversion described below.

A light emitting diode element 29 is installed on the upper surface 26a of the aforementioned glass epoxy substrate 22, substantially directly above the transparent resin section 27. This light emitting diode element 29 is a blue colored light emitting element made from a gallium nitride based compound semiconductor, and has a structure in which an n-type semiconductor 31 and a p-type semiconductor 32 are grown on the upper surface of a sapphire substrate 30 of transparent glass. Electrodes are provided on the respective upper surfaces of both the n-type semiconductor 31 and the p-type semiconductor 32, although in this embodiment non-transparent light blocking electrodes 33, 34 are formed over the entire upper surfaces of the n-type semiconductor 31 and the p-type semiconductor 32 respectively, and consequently light emission in an upward direction is essentially completely blocked out. These light blocking electrodes 33, 34 and the aforementioned cathode electrode 23 and the anode electrode 24 provided on the glass epoxy substrate 22, are connected with bonding wires 35, 36.

The light emitting diode element 29 is fixed to the upper surface of the transparent resin section 27 via a transparent adhesive 37 applied to the lower surface of the light emitting diode element 29. Furthermore, the light emitting diode element 29 and the bonding wires 35, 36 are protected by a rectangular transparent resin sealing body 38 formed on the upper surface of the glass epoxy substrate 22.

According to a light emitting diode 21 of the type of construction described above, blue light is emitted in both an upward and a downward direction from the interface between the n-type semiconductor 31 and the p-type semiconductor 32 of the light emitting diode element 29. However, the blue light emitted in the upward direction is blocked by the light blocking electrodes 33, 34 provided across the entire upper surface of the light emitting diode element 29, and is reflected off the light blocking electrodes 33, 34 with almost no light penetrating into the resin sealing body 38. The reflected light, together with the blue light which was emitted in a downward direction through the sapphire substrate 30, passes through the transparent adhesive 37 and the transparent resin section 27 filling the through hole 25 in the glass epoxy substrate 22, and is irradiated out from the lower surface 26b of the glass epoxy substrate 22. During this emission process, the fluorescent material 28 dispersed in the transparent resin section 27 is excited by the short wavelength of the blue light, and causes a wavelength conversion of the blue light yielding a yellowish light emission. Subsequent color mixing of the original blue light and the wavelength converted light means an almost white light emission can be obtained from the lower surface 26b of the glass epoxy substrate 22.

As follows is a description of a method of surface mounting a light emitting diode 21 of the construction described above. FIG. 2 is a diagram showing a light emitting diode 21 which has been surface mounted onto a motherboard 41. In this embodiment, a square shaped insertion hole 42 into which the resin sealing body 38 of the light emitting diode 21 can be fitted, is formed in advance in the motherboard 41. Then, during surface mounting, the light emitting diode 21 is turned upside down and mounted onto the motherboard 41, with the entire resin sealing body 38 dropping into the insertion hole 42. The outer periphery of the glass epoxy substrate 22 installs down onto the area surrounding the insertion hole 42, and the cathode electrode 23 and the anode electrode 24 provided on top of the glass epoxy substrate 22 are then fixed with solder 45 to a wiring pattern 43, 44 printed on the area of the motherboard 41 surrounding the insertion hole 42.

In the mounting means described above, because the light emitting diode 21 is mounted upside down, the light emitting diode 21 irradiates light upward from the motherboard 41. During this irradiation, because the wavelength conversion from blue light to white light occurs inside the transparent resin section 27 of the glass epoxy substrate 22 which incorporates the fluorescent material 28, a high intensity white light emission of excellent directivity can be obtained. Furthermore, because the height and width of the transparent resin section 27 comprising the dispersed fluorescent material 28 are quite large, the wavelength conversion proceeds sufficiently within the transparent resin section 27, and the color adjustment is simple. Moreover, by making the internal wall of the insertion hole 42 a reflective surface, the upward directivity of the light emission can be improved even further.

The overall height dimension h2 including the motherboard 41 amounts to only the thickness of the motherboard 41 plus the thickness of the glass epoxy substrate 22 of the light emitting diode 21. Consequently, compared with conventional devices, the overall height dimension can be reduced by an amount equivalent to the thickness of the resin sealing body 38.

Figure 3:
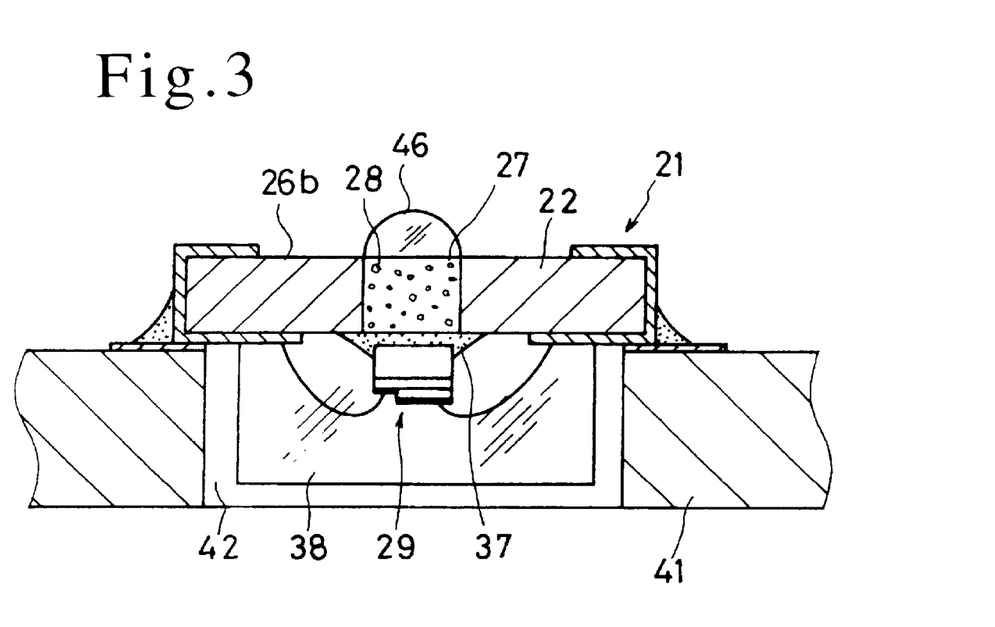
FIG. 3 is a cross-sectional view similar to FIG. 2, showing a second embodiment of a light emitting diode according to the present invention.

FIG. 3 is a diagram showing a second embodiment of the present invention. This embodiment is of substantially the same construction as the previous embodiment, with the exception that a hemispherical lens section 46 is provided on the lower surface 26b of the glass epoxy substrate 22, directly above the transparent resin section 27, and consequently a detailed description of the embodiment is not given here. The lens section 46 is also formed of a transparent resin. In this second embodiment, light passing through the transparent resin section 27 comprising the dispersed fluorescent material 28 is refracted by the lens section 46 at the lower surface 26b of the glass epoxy substrate 22. As a result, the convergence of the light can be increased, enabling an improvement in the intensity of the emitted white light.

In both of the embodiments described above, the situation was described where a fluorescent material 28 was dispersed within the transparent resin section 27 used to fill the through hole 25 of the glass epoxy substrate 22. However, the fluorescent material 28 could also be dispersed within the transparent adhesive 37.

Figure 4:
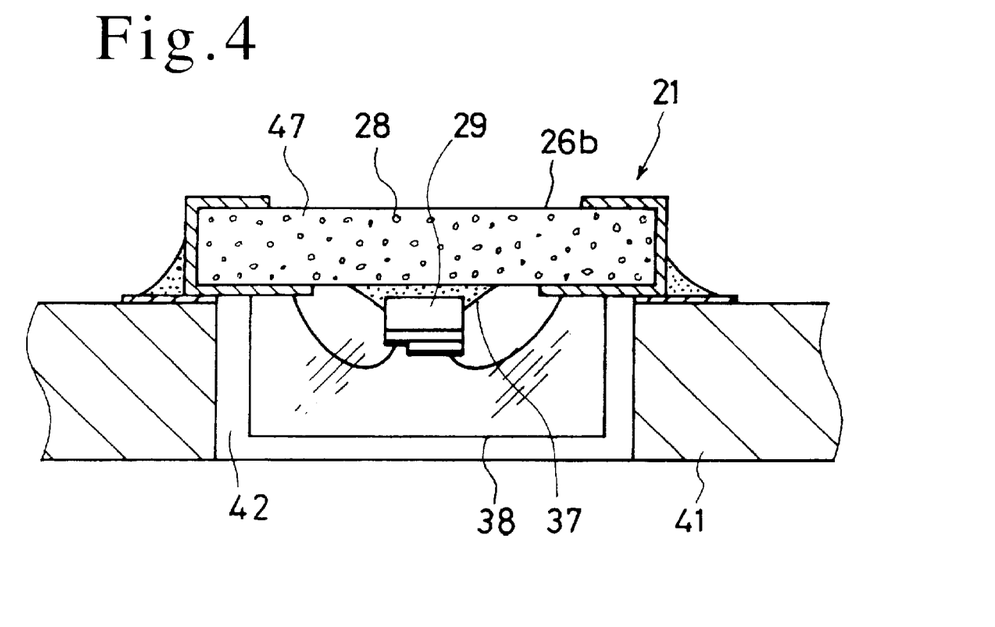
FIG. 4 is a cross-sectional view similar to FIG. 2, showing a third embodiment of a light emitting diode according to the present invention.

FIG. 4 is a diagram showing a third embodiment of the present invention. In this third embodiment, the base material is constructed of a transparent resin substrate 47, and a fluorescent material 28 is dispersed within this substrate. As with the previous embodiments, a light emitting diode element 29 comprising a gallium nitride based compound semiconductor is fixed to the transparent resin substrate 47 with a transparent adhesive 37, and the upper surface of the light emitting diode element 29 is protected by a transparent resin sealing body 38. The light emitting diode element 29 is mounted upside down onto the motherboard 41, and irradiates light upward from the motherboard 41, in the same manner as the previous embodiments. In this third embodiment, the entire transparent resin substrate 47 comprises the transparent body, and so the device is applicable to wide range irradiation. However, as with the previous embodiment, in those cases where an improved directivity and convergence is required, a hemispherical lens section could also be provided at the lower surface 26b of the transparent resin substrate 47, or a fluorescent material dispersed within the transparent adhesive.

Figure 5:
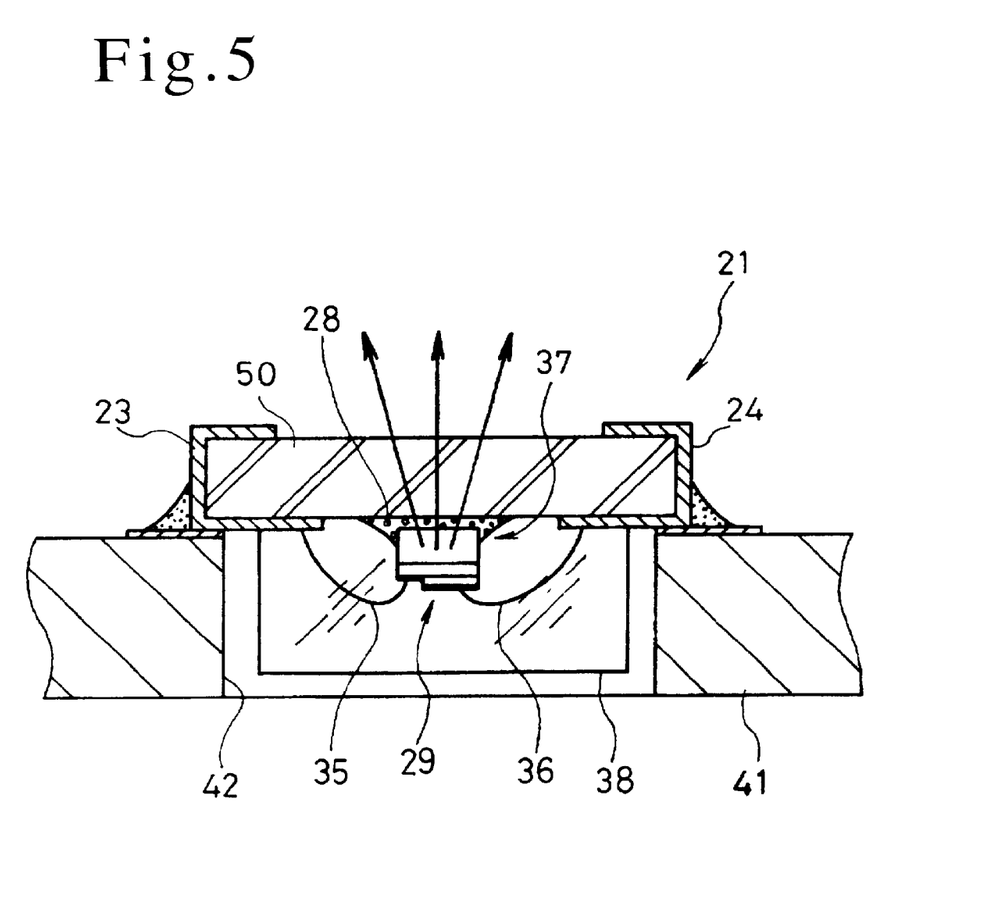
FIG. 5 is a cross-sectional view similar to FIG. 2, showing a fourth embodiment of a light emitting diode according to the present invention.

FIG. 5 is a diagram showing a fourth embodiment of the present invention. In a light emitting diode 21 according to this embodiment, the base material is composed of a transparent glass substrate 50, and a cathode electrode 23 and an anode electrode 24 are patterned on the transparent glass substrate 50 using a technique such as vapor deposition or etching. As with the previous embodiments, a light emitting diode element 29 comprising a gallium nitride based compound semiconductor is fixed with a transparent adhesive 37 to the transparent glass substrate 50 which serves as the transparent body, and the upper surface of the light emitting diode element 29 is protected by a transparent resin sealing body 38. However, in this fourth embodiment, a fluorescent material 28 has been dispersed within the transparent adhesive 37.

In the same manner as the previous embodiments, during mounting onto a motherboard 41, the light emitting diode 21 is fixed upside down, with the resin sealing body 38 dropping into an insertion hole 42 formed in the motherboard 41. As a result, light irradiates upward from the motherboard 41. The aforementioned wavelength conversion occurs within the transparent adhesive 37 comprising the dispersed fluorescent material 28, with the converted light passing straight out through the transparent glass substrate 50, and so a highly reliable white light emission of good intensity can be obtained over prolonged periods.

Figure 6:
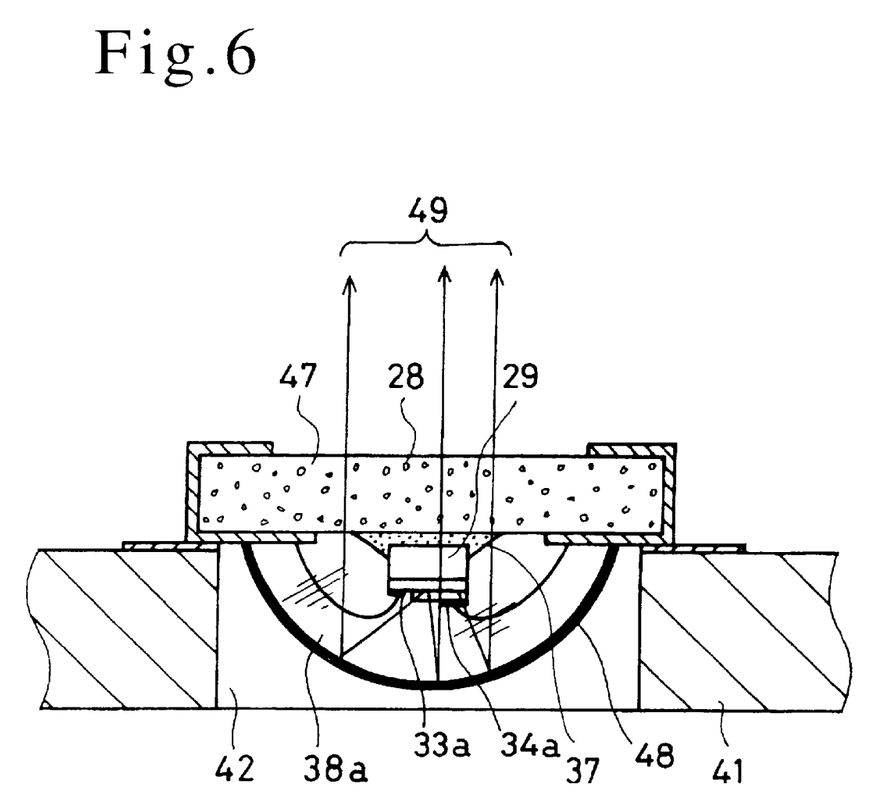
FIG. 6 is a cross-sectional view similar to FIG. 2, showing a fifth embodiment of a light emitting diode according to the present invention.

FIG. 6 is a diagram showing a fifth embodiment of the present invention. In this embodiment, a pair of electrodes 33a, 34a are provided partially covering the upper surface of a light emitting diode element 29 comprising a gallium nitride based compound semiconductor, and a resin sealing body 38a for sealing the light emitting iode element 29 is formed in a dome shape. The outer surface of the resin sealing body 38a is coated with a reflective film 48. In the same manner as the third embodiment, the base material is formed from a transparent resin substrate 47 with a fluorescent material 28 dispersed therein. The pair of electrodes 33a, 34a need not necessarily be non-transparent. The resin sealing body 38a is formed from a transparent resin material, and the reflective film 48 is formed by vapor deposition of silver or aluminum or the like.

Consequently in this embodiment, because the electrodes 33a, 34a are only partially formed, light emitted from the light emitting diode element 29 in the direction of the resin sealing body 38a, passes into the resin sealing body 38a and is reflected by the reflective film 48. At this point, the reflective film 48 functions like a concave lens, converting the reflected light into a parallel light beam 49 which passes through the transparent resin substrate 47. During this passage through the transparent resin substrate 47, the light excites the fluorescent material 28 dispersed within the transparent resin substrate 47 and undergoes a wavelength conversion.

Moreover, the light blocking electrodes 33, 34 provided on the upper surface of the light emitting diode element 29 in each of the first embodiment through to the fourth embodiment could also be limited to partially formed electrodes. In such cases, light emission can be guided towards the lower surface 26b of the glass epoxy substrate 22 by forming the resin sealing body 38 of a non-transparent resin, thereby blocking the transmission of light, or by providing a reflective film on the outer surface of the resin sealing body 38 in the same manner as the fifth embodiment. The shape of the resin sealing body in those cases where a reflective film is provided thereon, may be either rectangular or dome shaped.

Figure 7:
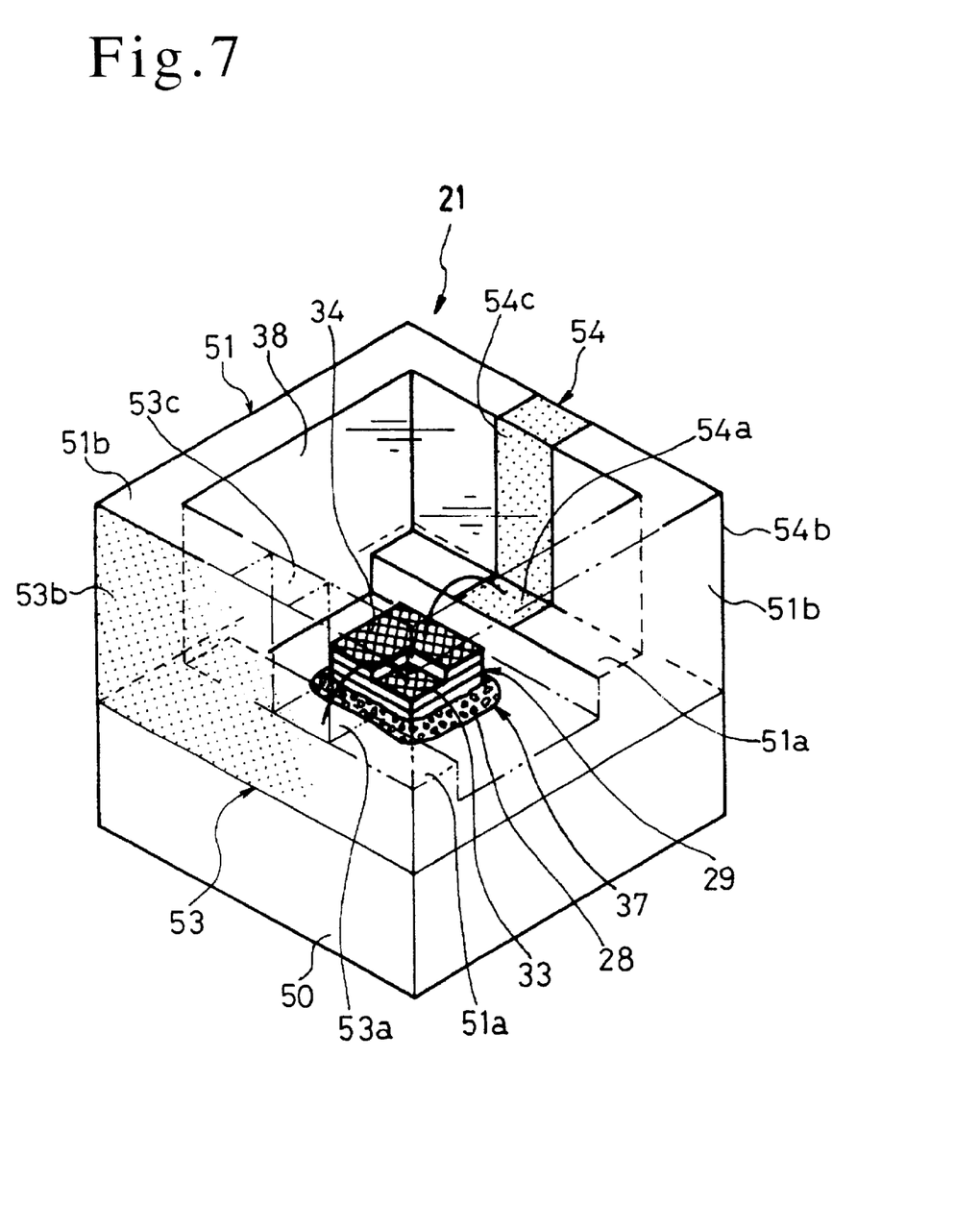
FIG. 7 is a perspective view showing a sixth embodiment of a light emitting diode according to the present invention.
Figure 8:
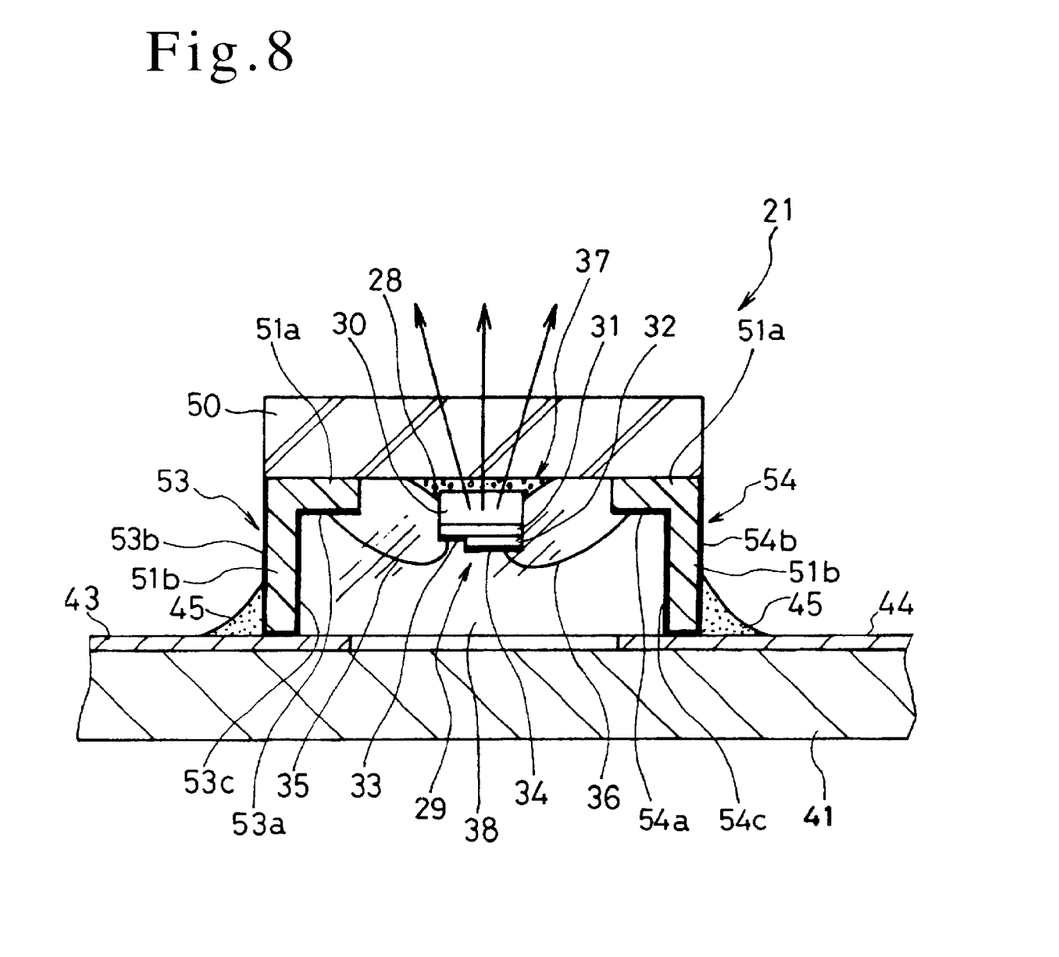
FIG. 8 is a cross-sectional view showing the light emitting diode of FIG. 7 mounted onto a motherboard.

FIG. 7 and FIG. 8 are diagrams showing a sixth embodiment of the present invention. A light emitting diode 21 according to this embodiment comprises a square shaped transparent glass substrate 50, a frame 51 on which are formed external connection electrodes 53, 54 at the left and the right sides of the transparent glass substrate 50, and a light emitting diode element 29 installed in the center of the upper surface of the transparent glass substrate 50. The transparent glass substrate 50, which functions as a transparent body, uses typical colorless, transparent glass.

In the same manner as the previous embodiments, the light emitting diode element 29 is a blue light emitting element comprising a gallium nitride based compound semiconductor in which an n-type semiconductor 31 and a p-type semiconductor 32 have been grown on the upper surface of a sapphire substrate 30. Non-transparent light blocking electrodes 33, 34 are formed on the upper surface of the light emitting diode element 29.

The light emitting diode element 29 is fixed to the upper surface of the transparent glass substrate 50 by a thick application of a transparent adhesive 37. A fluorescent material 28 comprising an yttrium compound or the like is dispersed within the transparent adhesive 37, and is able to convert the blue light emitted from the light emitting diode 21 to visible light of a longer wavelength.

The external connection electrodes 53, 54 are formed on the square shaped plastic frame 51 which covers the outer periphery of the upper surface of the transparent glass substrate 50. The frame 51 is manufactured in a separate process to the transparent glass substrate 50, and is fixed to the upper surface of the substrate on which the light emitting diode element 29 is installed, with an adhesive or the like. The external connection electrodes 53, 54 are patterned at the time of the frame 51 manufacture using a technique such as vapor deposition, and comprise a cathode electrode 53a and an anode electrode 54a connected via bonding wires 35, 36 to the two light blocking electrodes 33, 34 respectively of the light emitting diode element 29, as well as motherboard connection electrodes 53b, 54b. The cathode electrode 53a and the anode electrode 54a are formed of a predetermined width on a pair of internal base sections 51a provided within the frame 51, and the motherboard connection electrodes 53b, 54b are provided across the entire outer surface of corresponding vertical side walls 51b. The two sets of electrodes are connected by printed electrodes 53c, 54c respectively.

The inside of the frame 51 is entirely filled with a resin sealing body 38. This filling process causes the sealing of the light emitting diode element 29 mounted on the upper surface of the transparent glass substrate 50, and the bonding wires 35, 36. The resin sealing body 38 needs not necessarily be colorless and transparent.

Next, a description of a method of surface mounting a light emitting diode 21 of the construction described above will be made. FIG. 8 is a diagram showing a light emitting diode 21 which has been surface mounted onto a motherboard 41. In this embodiment, the light emitting diode 21 is mounted upside down on the motherboard 41, and the motherboard connection electrodes 53b, 54b formed on the outer surface of the frame 51 are fixed with solder 45 to wiring patterns 43, 44 on the motherboard 41. Because the motherboard connection electrodes 53b, 54b are provided across the entire outer surfaces of the side walls 51b, adjustment of the mounting position is simple, and a secure attachment can be obtained with the solder 45.

In the mounting means described above, because the light emitting diode 21 is mounted upside down, the light emitting diode 21 irradiates light upward from the motherboard 41.

During this irradiation, wavelength conversion occurs within the transparent adhesive 37 comprising the dispersed fluorescent material 28, with the converted light passing straight out through the transparent glass substrate 50, and so a highly reliable white light emission of high intensity can be obtained over prolonged periods.

Figure 9:
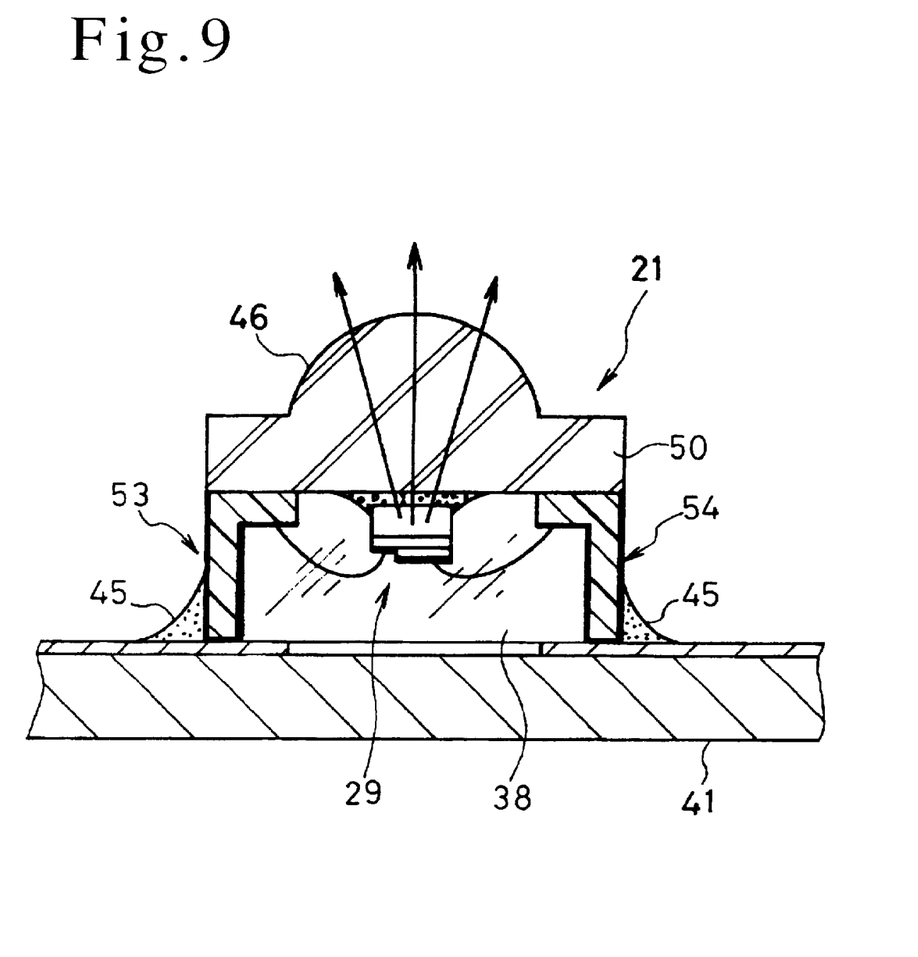
FIG. 9 is a cross-sectional view similar to FIG. 8, showing a seventh embodiment of a light emitting diode according to the present invention.

FIG. 9 is a diagram showing a seventh embodiment of the present invention. A light emitting diode 21 according to this embodiment is of substantially the same construction as the sixth embodiment, with the exception that a hemispherical condenser lens section 46 is integrated into the lower surface of the transparent glass substrate 50, and consequently a detailed description of the embodiment is not given here. The condenser lens section 46 is also formed of transparent glass, and is formed as an integrated part of the transparent glass substrate 50 during the molding of the glass substrate 50. By providing this type of condenser lens section 46, light emitted from the transparent glass substrate 50 is diffracted inward by the condenser lens section 46. As a result, the convergence of the light can be increased, enabling an improvement in the intensity of the emitted white light.

Figure 10:
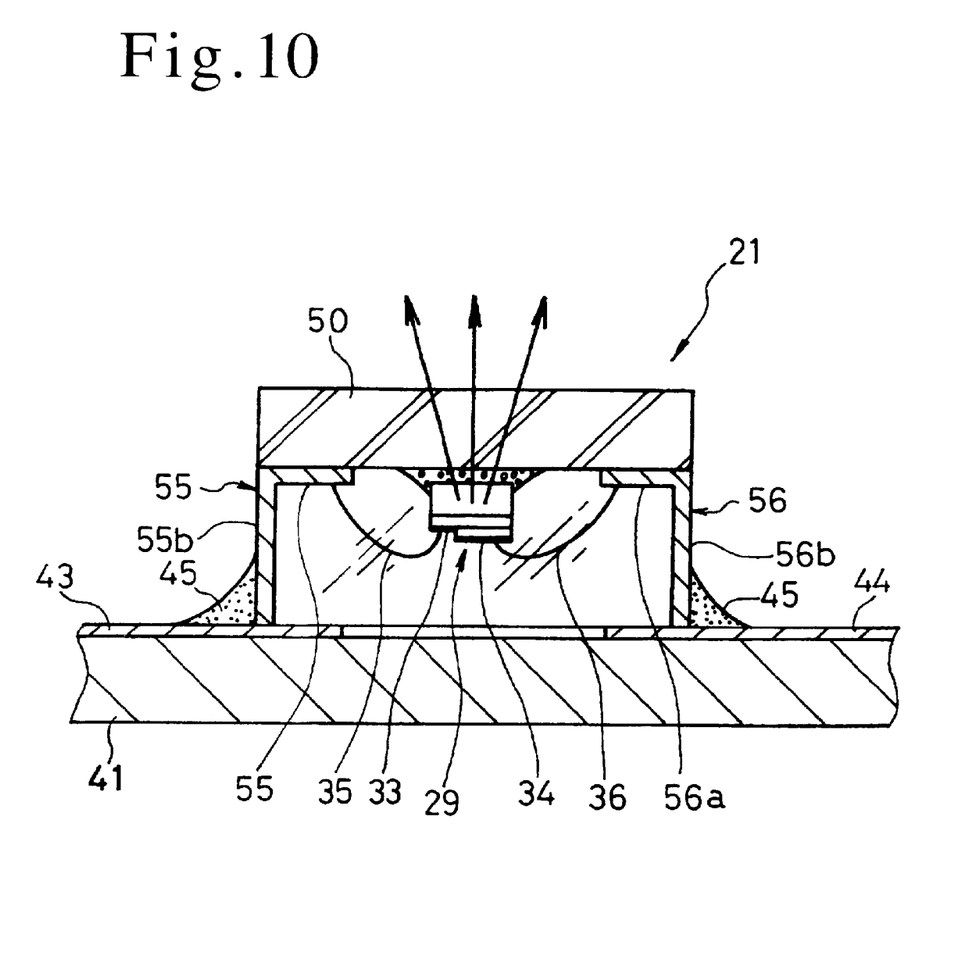
FIG. 10 is a cross-sectional view similar to FIG. 8, showing an eighth embodiment of a light emitting diode according to the present invention.

FIG. 10 is a diagram showing an eighth embodiment of the present invention. A light emitting diode 21 according to this embodiment is of substantially the same construction as the sixth embodiment, with the exception that the external connection electrodes 55, 56 are formed of L-shaped metal plates, and consequently a detailed description of the embodiment is not given here. The external connection electrodes 55, 56 are fixed by adhesive to the upper surface of the transparent glass substrate 50. Two inner bottom surfaces 55a, 56a of the external connection electrodes 55, 56 are connected via bonding wires 35, 36 to the two light blocking electrodes 33, 34 respectively of the light emitting diode element 29, whereas the outer surfaces 55b, 56b are fixed with solder 45 to wiring patterns 43, 44 on a motherboard 41. In all of the embodiments described above, the descriptions focussed on wavelength conversion type light emitting diodes. However, the present invention may, of course, be applied to any light emitting diode which uses a transparent substrate such as a sapphire substrate and has a light emitting diode element in which light is irradiated out through the lower surface, even if the light emitting diode does not utilize wavelength conversion. In such a case, a highly reliable light emission of high intensity can still be obtained.

Furthermore, in all of the above embodiments, the light emitting diode element and the external connection electrodes were connected with bonding wires. However, the present invention is not limited to such connections, and for example, also includes connection methods such as flip-chip mounting which using solder bumps.

Moreover, in the above embodiments, the descriptions focussed on the case where light blocking electrodes were formed on the upper surface of the light emitting diode element. However, the present invention is of course not limited to such embodiments, and includes devices where the upper surface of the light emitting diode element can be blocked by alternate means, such as by forming the resin sealing body of a black resin for example.

INDUSTRIAL APPLICABILITY

As described above, according to a light emitting diode according to the present invention, by mounting the light emitting diode upside down on the motherboard, light can be irradiated in an upward direction from the motherboard. Furthermore, by dropping the resin sealing body of light emitting diode down into a hole formed in the motherboard the overall height dimension of the light emitting diode, including the thickness of the motherboard, can be reduced to a value smaller than conventional surface mounted devices, enabling the manufacture of thinner devices.

Furthermore, in a light emitting diode according to the present invention light is emitted out through the base material, and so deterioration of the resin sealing body due to ultraviolet light is prevented. Consequently, a highly reliable device can be provided in which any decrease in light intensity is suppressed, even with continued use over prolonged periods.

What is claimed is:

1. A light emitting diode prepared by mounting a light emitting diode element on an upper surface of a base material and protecting said light emitting diode element with a resin sealing body, wherein a transparent body is provided in said base material which extends from the upper surface through to a lower surface thereof, a light emitting diode element comprising a gallium nitride based compound semiconductor with a transparent element substrate is fixed on top of said transparent body with a transparent adhesive, a non-transparent section is provided above said light emitting diode element, and light emitted from said light emitting diode element passes through said transparent body to be guided out through the lower surface of said base material.

2. The light emitting diode according to claim 1, wherein a through hole is provided in said base material which extends from the upper surface through to the lower surface thereof, and said transparent body is formed by filling said through hole with a transparent resin.

3. The light emitting diode according to claim 1, wherein a fluorescent material comprising an yttrium compound is dispersed and mixed into at least one of said transparent body and said transparent adhesive.

4. The light emitting diode according to claim 1, wherein a condenser lens section is provided on said lower surface of said base material, below said transparent body.

5. The light emitting diode according to claim 1, wherein said base material is any one of a glass epoxy substrate, a transparent resin substrate and a transparent glass substrate.

6. The light emitting diode according to claim 1, wherein said non-transparent section provided above said light emitting diode element is a pair of light blocking electrodes provided on an upper surface of said light emitting diode element.

7. The light emitting diode according to claim 1, wherein said non-transparent section provided above said light emitting diode element is a reflective film covering an outer surface of said transparent resin sealing body.

8. A light emitting diode, wherein when the light emitting diode according to claim 1 is mounted on a motherboard, said light emitting diode is mounted upside down, with said resin sealing body dropping into a hole provided in said motherboard, and periphery sections of said hole connecting external connection electrodes of said light emitting diode with a wiring pattern of said motherboard.

* * * * *